United States Patent [19]
Pohl et al.

[11] Patent Number: 6,057,595
[45] Date of Patent: May 2, 2000

[54] INTEGRATED SEMICONDUCTOR CIRCUIT HOUSING

[75] Inventors: Jens Pohl, Bernhardswald; Bruno Golz, Jesenwang; Harald Widner, Abensberg, all of Germany

[73] Assignee: Siemens Aktiengesellschaft, Munich, Germany

[21] Appl. No.: 09/221,774

[22] Filed: Dec. 28, 1998

Related U.S. Application Data

[63] Continuation of application No. PCT/DE97/01273, Jun. 19, 1997.

[30]     Foreign Application Priority Data

Jun. 28, 1996  [DE]   Germany .......................... 196 26 087

[51] Int. Cl.⁷ .................. H01L 23/48; H01L 23/495; H01L 23/28
[52] U.S. Cl. .................. 257/696; 257/673; 257/666; 257/698; 257/693; 257/797; 257/787
[58] Field of Search .................. 257/666, 643, 257/673, 669, 674, 696, 698, 787, 797

[56]        References Cited

U.S. PATENT DOCUMENTS

| | | |
|---|---|---|
| 5,355,283 | 10/1994 | Marrs et al. . |
| 5,744,827 | 4/1998 | Jeong et al. .............................. 257/686 |
| 5,760,471 | 6/1998 | Fujisawa et al. ........................ 257/692 |
| 5,866,939 | 2/1999 | Shin et al. ............................... 257/666 |

*Primary Examiner*—Alexander Oscar Williams
*Attorney, Agent, or Firm*—Herbert L. Lerner; Laurence A. Greenberg; Werner H. Stemer

[57]            ABSTRACT

The integrated semiconductor circuit has a semiconductor chip, a housing that accommodates the semiconductor chip, and a lead frame that connects the contact areas of the semiconductor chip and forms external terminals of the integrated semiconductor circuit. The conductors of the lead frame are sunk, in the regions of the housing in which the distance between the edge of the housing and the semiconductor chip is relatively large, to the central plane of the housing, with the result that the conductors of the lead frame have depressions in those regions.

5 Claims, 2 Drawing Sheets

INTEGRATED SEMICONDUCTOR CIRCUIT HOUSING

CROSS-REFERENCE TO RELATED APPLICATION

This is a continuation of copending International Application PCT/DE97/01273, filed Jun. 19, 1997, which designated the United States.

BACKGROUND OF THE INVENTION

Field of the Invention

The present invention relates to an integrated semiconductor circuit, in particular a semiconductor memory, having a semiconductor chip, a housing, which accommodates the semiconductor chip, and a lead frame that connects the contact areas of the semiconductor chip with external terminals of the integrated semiconductor circuit. First regions of the lead frame, which are connected to the contact areas, and second regions of the lead frame, which are connected to the external terminals, are located essentially in an identical plane.

For semiconductor memories, for example 16 megabit semiconductor memories, it is possible to use so-called TSOP housings (TSOP=Thin small outline package) with a housing thickness of about 1 mm or else so-called SOJ housings (SOJ=Small Outline J Bend) with a housing thickness of about 2.5 mm. If the housings are constructed in LOC technology (LOC=Lead-On-Chip), then housing connections are not provided on the housing centrosymmetrically or centrically. The same also applies to the routing of the conductors of the lead frame which connect respective contact areas or pads of the semiconductor chip to the housing connections. In this case, the contact areas serve for the mechanical fixing of the semiconductor chip to the lead frame, while the electrical connection is effected via, for example, gold wires to bonding pads.

If the semiconductor chip happens to be very much smaller than the housing, which may be the case when an existing housing is intended to be used for a considerably smaller semiconductor chip, then the housing has relatively large regions in which no semiconductor chip is present.

FIG. 3 shows a plan view of a prior art integrated semiconductor circuit, the cross section of which is illustrated in FIG. 4. This integrated semiconductor circuit comprises a semiconductor chip 1, contact areas 2 arranged thereon, conductors 3 of a lead frame 4, which are mechanically connected to the contact areas 2, bonding wires 10 made of gold, for example, which serve the purpose of electrical connection between the conductors 3 and electrical contacts ("bonding pads") 9, as well as a housing 5 made of a molding compound, for example epoxy resin. In order to simplify the illustration, the contact areas 2 are only illustrated in FIG. 4, which, incidentally, shows the conductors 3 as if the housing 5 were omitted. As is evident, then, from FIGS. 3 and 4, in this case the relatively small semiconductor chip 1 is accommodated in the housing 5 which is large in comparison therewith. There is thus a zone A, in which the semiconductor chip 1 and the housing 5 are present in a side section, whereas in zones B, which are outside the region of the semiconductor chip 1, only the conductors 3 of the lead frame 4 and also the molding compound of the housing 5 are present. Although FIGS. 3 and 4 show an example in which the semiconductor chip 1 is arranged centrically in the housing 5, these zones B located to the left and right of the semiconductor chip 1 in FIGS. 3 and 4 are relatively large. In the case of a noncentric arrangement of the semiconductor chip 1 in the housing 5, that is to say if the semiconductor chip 1 is accommodated in the housing 5 in a manner shifted to the left in FIGS. 3 and 4, one of these zones B, the zone B located on the right in FIGS. 3 and 4 in the example given, would gain even greater dimensions.

This means that, in the integrated semiconductor circuit illustrated, the semiconductor chip 1 and the housing 5 are present in the zone A, whereas the housing 5 and the conductors 3 are present in the zones B. The thermal expansion coefficients of the semiconductor material of the semiconductor chip 1 and of the conductor 3 are relatively close to one another. However, the thermal expansion coefficient of the molding compound of the housing 5 differs considerably from the thermal expansion coefficients of the semiconductor material and of the conductor. As a result, the integrated semiconductor circuit is thermally balanced in zone A ("balanced package"), whereas such thermal balancing is not present in zones B ("non-balanced package"). Flexure thus occurs in the integrated semiconductor circuit, this being indicated by dashed lines in FIG. 4. Flexure of this type is greater, the smaller the thickness of the housing 5 is and the further the zones B extend beyond the zone A. Flexure of this type is extremely undesirable for the mounting of the integrated semiconductor circuit since it causes alteration of the housing dimensions of the integrated semiconductor circuit and, possibly, loss of the coplanarity of the integrated semiconductor circuit with other components. This may have an adverse effect both on the mechanical and on the electrical properties of the product.

Patent Abstracts of Japan 18(643)(E1640) and JP A 6252333 describe a semiconductor configuration having a semiconductor chip, a lead frame and a surrounding housing. The semiconductor chip is applied to a chip island of the lead frame. The connection fingers are formed in such a way that, in an alternating manner, first of all parts of the connection fingers are accessible on the top side of the semiconductor component and then parts are accessible on the underside of the semiconductor component. There are, moreover, connection fingers which are routed outward on the side of the housing. A large pitch spacing of the connection fingers can be obtained in this way.

Patent Abstracts of Japan 16(014)(E1154) and JP A 3235360 describe a semiconductor configuration having a semiconductor chip, a lead frame and a surrounding housing. In this case, the first ends of the connection fingers are fixed on a top side of the semiconductor chip according to the lead on chip principle. The regions of the connection fingers which are situated within the housing have a stepped form, with the result that they penetrate through the housing in the central plane. By virtue of the step in the connection fingers, the semiconductor chip can be fitted approximately in the central plane of the housing.

SUMMARY OF THE INVENTION

It is accordingly an object of the invention to provide an integrated semiconductor circuit, which overcomes the above-mentioned disadvantages of the heretofore-known devices and methods of this general type and in which flexure of the housing is reliably avoided even when, in the housing, the actual semiconductor chip occupies only a relatively small space and conductors are routed noncentrically.

With the foregoing and other objects in view there is provided, in accordance with the invention, an integrated semiconductor circuit, in particular a semiconductor memory, comprising:

a semiconductor chip having a plurality of contact areas, a periphery, and a top side opposite the contact areas;

a housing surrounding the semiconductor chip, the housing having a central plane;

a lead frame formed with a plurality of individual conductors connected to the contact areas of the semiconductor chip and defining external terminals of the semiconductor circuit;

the conductors of the lead frame having first regions at the contact areas, and second regions at the external terminals, the first and second regions being disposed substantially in a single plane;

the conductors of the lead frame having third regions between the first and second regions and outside the periphery of the semiconductor chip, the third regions being sunk from the plane of the first and second regions towards the top side of the semiconductor chip and substantially to the central plane of the housing.

In other words, the objects of the invention are satisfied in that the conductors of the lead frame are sunk in third regions, which are located between the first and second regions and are arranged outside the periphery of the semiconductor chip, from the plane of the first and second regions to the top side of the semiconductor chip, said top side being situated opposite the contact areas. In this case, said sinking can be performed for example to an extent such that the corresponding parts of the conductors lie approximately in the central plane of the integrated semiconductor circuit or of the housing thereof. Thermal balancing is also achieved here in a simple manner by virtue of the sinking of the conductors of the lead frame in the third regions, with the result that flexure is reliably avoided. The sinking itself can be achieved in a simple manner by the lead frame being correspondingly embossed in the course of its production. The lead frame which is correspondingly configured by such embossing and provided with sunken parts is then connected in a customary manner to the semiconductor chip and encapsulated in the housing.

It is advantageous to take the "sinking" of the third regions approximately as far as the central plane of the housing. Specifically, if the conductors of the lead frame in the third regions are approximately at the same distance from the top side and the underside of the integrated semiconductor circuit or the housing thereof, then thermal balancing is readily achieved in this case.

In accordance with an added feature of the invention, the lead frame is formed of nickel/iron and copper alloys and the housing is formed of an epoxy-based molding compound. While it will be understood that the present invention is not restricted to specific materials for lead frames and housings, since the thermal balancing is present when the lead frame is arranged approximately at the same distance from the top side and underside of the housing, nonetheless preferred materials are the nickel/iron and copper alloys for the lead frame and epoxy-based molding compounds for the housing.

In accordance with an additional feature of the invention, the third regions are formed in zones of the integrated semiconductor circuit in which a distance between the semiconductor chip and an edge of the housing is a maximum. Particularly large degrees of flexure of the housing can be reliably avoided in this way.

In accordance with a concomitant feature of the invention, there is provided a method for producing the above-described integrated semiconductor circuit. The method comprises:

embossing the conductors in the third regions during the production of the lead frame; and subsequently connecting the semiconductor chip to the lead frame and encapsulating with the housing.

The lead frame can be sunk in a particularly simple manner in this way.

Other features which are considered as characteristic for the invention are set forth in the appended claims.

Although the invention is illustrated and described herein as embodied in an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
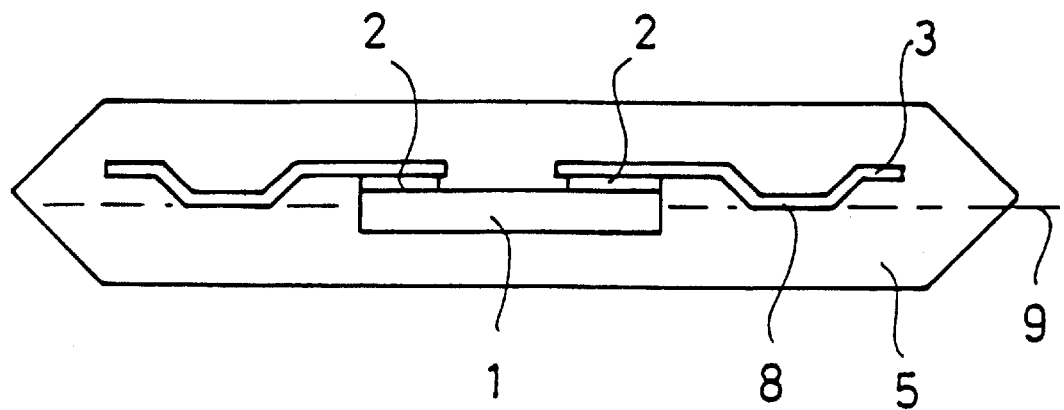
FIG. 1 diagrammatic side view of the integrated semiconductor circuit according to the invention.

The semiconductor chip and the conductors of the lead frame are illustrated throughout the drawing figures in order to clarify the invention. It will be understood that, in reality, they are intrinsically largely covered by the housing 5. It is further noted that corresponding parts are provided with the same reference symbols in all the figures.

Figure 2:
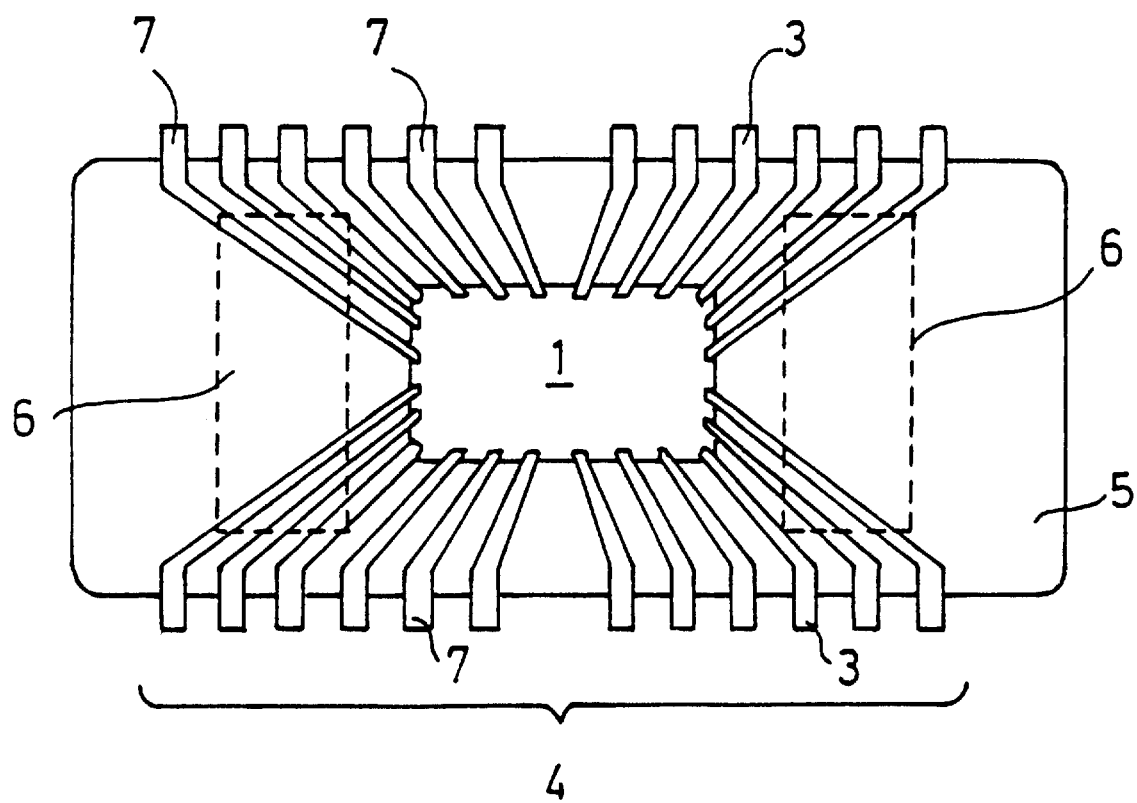
FIG. 2 is a plan view of the semiconductor circuit of FIG. 1.
Figure 3:
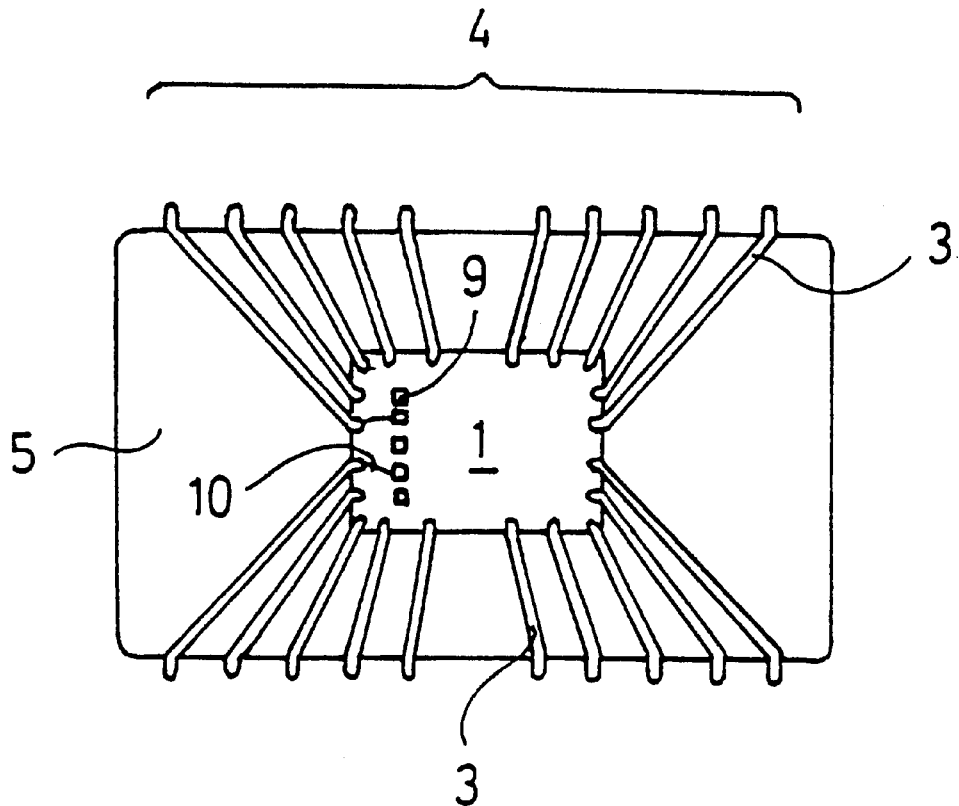
FIG. 3 is a plan view onto a prior art integrated semiconductor circuit.
Figure 4:
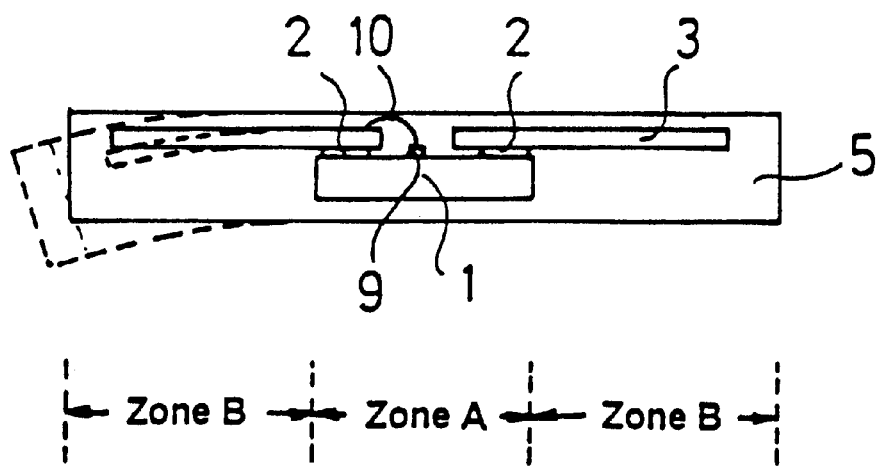
FIG. 4 is a diagrammatic side view of the semiconductor circuit of FIG. 3.

Referring now to the figures of the drawing in detail and first, particularly, to FIGS. 1 and 2 thereof, the conductors 3 of the lead frame 4 connect contact areas 2 of the semiconductor chip 1 to external terminals 7 of the integrated semiconductor circuit. The conductors 3 are in this case sunk in regions 6. These regions 6 are shown by dashed lines in FIG. 2 and are situated, in particular, in those parts of the integrated semiconductor circuit in which the distance between the semiconductor chip 1 and the edge of the housing 5 is relatively large. A depression 8 is produced in this way in the conductors 3 in the regions 6 (cf. FIG. 1). The depression is located approximately in the central plane 9 of the housing 5. As a result, the integrated semiconductor circuit is thermally balanced even in the regions 6, since the approximately identical distance between the depression 8 and the top side and the underside of the housing 5 means that flexure is reliably avoided in the event of heating. The contacts 9 and bonding wires 10 are not shown in FIGS. 1 and 2, in order to improve the illustration.

The invention can advantageously be applied to all integrated semiconductor circuits using LOC or CDL technology in which the conductors of a lead frame are intended to be brought to a balanced state using simple means.

We claim:

1. An integrated semiconductor circuit, comprising:

a semiconductor chip having a plurality of contact areas, a periphery, and a top side opposite said contact areas;

a housing surrounding said semiconductor chip, said housing having a central plane;

a lead frame formed with a plurality of individual conductors connected to said contact areas of said semiconductor chip and defining external terminals of the semiconductor circuit;

said conductors of said lead frame having first regions at said contact areas, and second regions at said external terminals, said first and second regions being disposed substantially in a single plane;

said conductors of the lead frame having third regions between said first and second regions and outside said periphery of said semiconductor chip, said third regions being sunk from the plane of said first and second regions towards said top side of said semiconductor chip and substantially to the central plane of said housing.

2. The integrated semiconductor circuit according to claim 1, wherein said lead frame is formed of nickel/iron and copper alloys and said housing is formed of an epoxy-based molding compound.

3. The integrated semiconductor circuit according to claim 1, wherein said third regions are formed in zones of the integrated semiconductor circuit in which a distance between said semiconductor chip and an edge of said housing is a maximum.

4. The integrated semiconductor circuit according to claim 1, wherein said chip is a semiconductor memory chip.

5. In a method for producing the integrated semiconductor circuit according to claim 1, which comprises:

embossing the conductors in the third regions during the production of the lead frame; and subsequently connecting the semiconductor chip to the lead frame and encapsulating with the housing.

* * * * *